United States Patent [19]

Nishimura

[11] 4,366,441
[45] Dec. 28, 1982

[54] SIGNAL-MUTING CIRCUIT FOR BRIDGE AMPLIFIER

[75] Inventor: Kiyomitsu Nishimura, Itami, Japan

[73] Assignee: Mitsubishi Denki Kabushiki Kaisha, Tokyo, Japan

[21] Appl. No.: 176,102

[22] Filed: Aug. 7, 1980

[30] Foreign Application Priority Data

Aug. 29, 1979 [JP] Japan .................. 54-110801

[51] Int. Cl.³ ............................ H03F 1/14; H03F 3/68
[52] U.S. Cl. .................................. 330/51; 330/207 P; 330/298
[58] Field of Search ................. 330/51, 146, 124 R, 330/295, 207 P, 298; 455/174, 194

[56] References Cited

PUBLICATIONS

G. Hamel TDA 2004: Ein Vielseitiger Stereo-Leistungsverstärker.
Funk-Tech (Germany), vol. 35, No. 12 (1980).
"A High-Power Hi-Fi Monolithic Amplifier", IEEE Trans. BTR, p. 311 (1974) p. 319.

Primary Examiner—James B. Mullins
Assistant Examiner—Gene Wan
Attorney, Agent, or Firm—Oblon, Fisher, Spivak, McClelland & Maier

[57] ABSTRACT

A signal-muting circuit, applied to a bridge amplifier comprises two amplifying means, performs signal-muting by shorting the input terminals of non-reversible buffer amplifiers forming the final stage of each amplifying means. Non-reversible amplifiers and said non-reversible buffer amplifiers in the amplifying means have the same voltage gain respectively.

9 Claims, 4 Drawing Figures

SIGNAL-MUTING CIRCUIT FOR BRIDGE AMPLIFIER

BACKGROUND OF THE INVENTION

1. Field of the Invention:

The present invention relates to a signal-muting circuit for a bridge amplifier using two amplifying means which performs the signal-muting without causing a great fluctuation of DC voltage in the amplifier.

2. Description of the Prior Art:

Signal-muting has often been carried out by the stopping of the operation of amplifiers. In this case, DC voltage in the amplifiers is greatly varied. Accordingly, the signal-muting usually causes a strong switching noise from a loudspeaker when a low frequency power amplifier is connected to the circuit because the DC voltage in each amplifier is greatly varied. The same result is found even though the signal-muting is carried out when the low frequency power amplifier is already connected.

SUMMARY OF THE INVENTION

It is an object of the present invention to provide a signal-muting circuit for signal-muting without causing great fluctuation of DC voltage in each amplifier, hence there will be no occurrence of an abnormal switching noise from a loudspeaker when it is applied to a low frequency power amplifier.

The foregoing and other objects of the present invention have been attained by providing a signal-muting circuit for a bridge amplifier comprising two amplifying means each formed by connecting a non-reversible amplifier and a non-reversible buffer amplifier in series wherein a short-circuit is formed through a switch between the input terminals of the non-reversible buffer amplifiers of the final stage in each amplifying means to perform the signal-muting.

BRIEF DESCRIPTION OF THE DRAWINGS

The same reference numerals designate the same or corresponding parts throughout the several figures.

DETAILED DESCRIPTION OF THE PREFERRED EMBODIMENT

Figure 1:
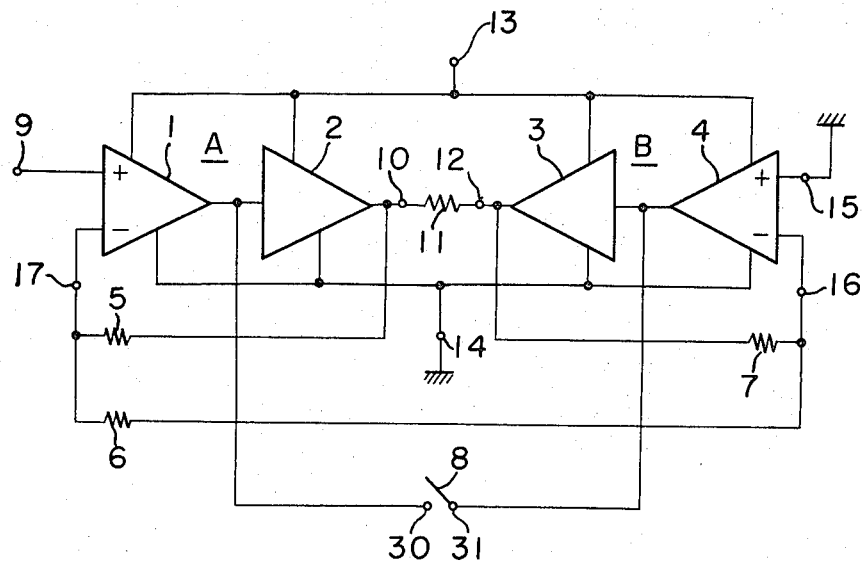
FIG. 1 is a circuit diagram of an embodiment of the present invention.

Referring to the drawings, certain embodiments of the present invention will be described.

In FIG. 1, the reference numerals (1) and (4) designate non-reversible amplifiers having the same voltage gain and (2) and (3) designate non-reversible buffer amplifiers having the same voltage gain. One amplifying means is formed by a combination of the non-reversible amplifier (1) and the non-reversible buffer amplifier (2) or a combination of (3) and (4). It is known to use a Darlington circuit for current amplification provided in the final stage in a low frequency power amplifier as the non-reversible buffer amplifier.

A signal supplied to the input terminal (9) of the amplifier (1) is amplified by the amplifiers (1) and (2) (which is referred to as an amplifying means A) to output from an output terminal (10). The output at the output terminal (10) is fed back to the feed-back terminal (17) of the amplifier (1) through a feed-back resistor (5). The feed-back signal is input to the feed-back terminal (16) of the amplifier (4) which is part of the other amplifying means B through a resistor (6). The input terminal (15) of the amplifier (4) being the same in phase is grounded so as to function as a reversible amplifier to the amplifying means B so that a signal having a phase opposite to that of the input to the feed-back terminal (16), i.e. the output from the output terminal (10), is output from an output terminal (12) by passing the signal through the amplifier (4) and (3).

The output at the output terminal (12) is fed back to the feed-back terminal (16) through feed-back resistor (7).

In the bridge amplifier described above, the voltage gain GV is given by the following equation.

$$GV = \frac{\text{resistance of feed-back resistor (5)} + \text{resistance of feed-back resistor (7)}}{\text{resistance of feed-back resistor (6)}} \quad (1)$$

The equation is given as follows when the resistance of the resistors (5) and (7) are equal.

$$GV = \frac{2 \times (\text{resistance of feed-back resistor (5)})}{\text{resistance of feed-back resistor (6)}} \quad (2)$$

When the resistances of the feed-back resistors (5) and (7) are equal, an output voltage of two times and an output power of four times as high as those obtained by earthing one end of a load (11) are fed to the load (11). Signals having the same amplitude but a shifted phase of 180°, that is, the opposite phase are output at terminals (30) and (31) since the amplifiers (2) and (3) are non-reversible amplifiers having the same voltage gain.

In this embodiment of the bridge amplifier, when the terminals (30) and (31) are shorted by the switch (8), the signal output from the amplifiers (1), (2), hence the amplifiers (3),(4) is lost since the respective signals output from the terminals (30),(31) areof the same amplitude and opposite phase. The attenuation caused by the short-circuit of the terminals (30),(31) becomes infinite by making the resistances of the resistors (5) and (7) equal. The potential at the terminal (30) is substantially the same as that at the terminal (31) and the short-circuiting does not cause a substantial fluctuation of the potential. Accordingly, almost no DC fluctuation is found at the terminals (10),(12) and almost no potential fluctuation is found at both ends of the load (11) when the switch (8) is short-circuited or a wire is cut. Abnormal noise is not caused by the short-circuiting of switch (8) or the wire-cutting even though a low frequency power amplifier is used instead of the amplifiers of the embodiment described above and a loudspeaker is used as the load. In the figure, the reference numeral (13) designates the terminal of the power source and (14) designates an ground terminal.

Figure 2:
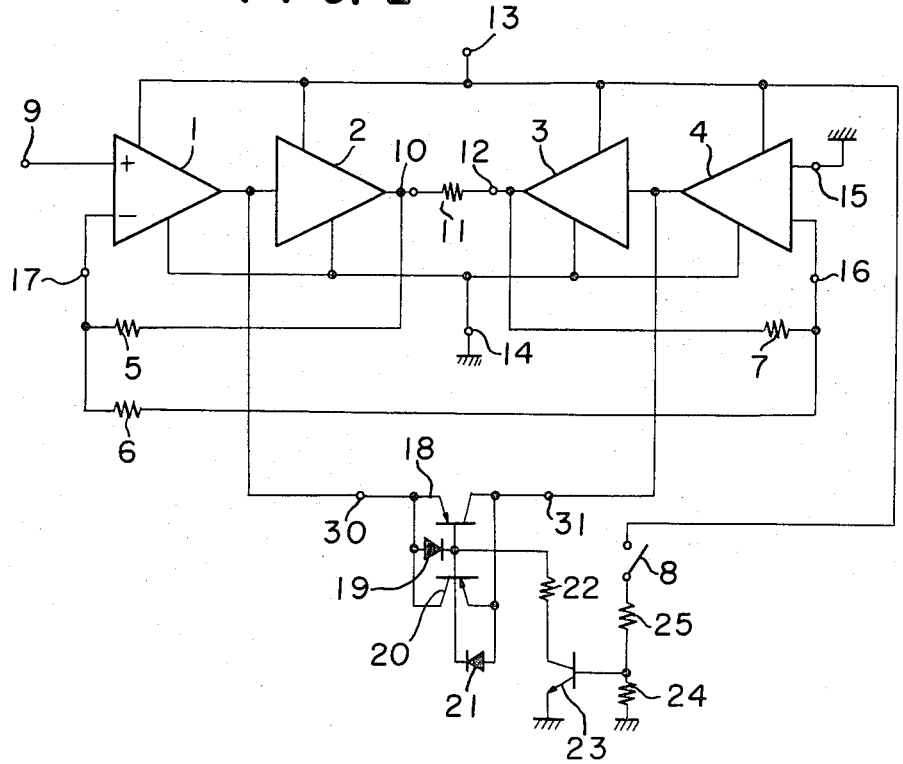
FIGS. 2, 3, and 4 are circuit diagrams of other embodiments of the present invention.

FIG. 2 is a circuit diagram of another embodiment of the present invention in which two PNP transistors and two diodes are used to form an electronic switch instead of the mannually operated switch (8) in FIG. 1. In FIG. 2, when the switch (8) is closed to connect a resistor (25) to the power source, an NPN transistor (23) is turned on to allow the passing of the base current of PNP transistors (18) and (20) which form the electronic switch; thus the transistors (18),(20) are turned on. The mutually opposite signals output at the terminals (30),(31) compensate each other, as described above with reference to FIG. 1, by the turning-on of the transistors (18),(20) and almost no fluctuation of DC potential is found whereby almost no fluctuation of potential across the output terminals (10),(12) (both ends of a load) is also found. The reference numerals (19),(21) designate buffer diodes for the hFE fluctuation or non-uniformity of the transistors (18),(20) and the reference numerals (22) and (24) designate resistors.

Figure 3:
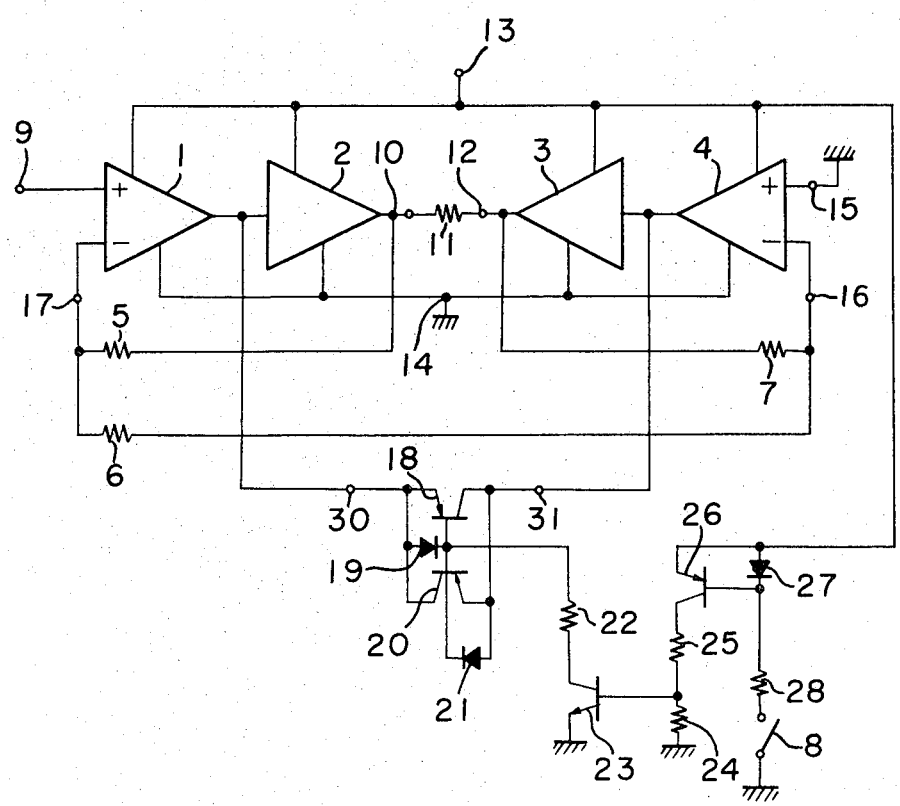

FIG. 3 is a circuit diagram of a further embodiment of the present invention. In this embodiment, the signal-muting is carried out by connecting a resistor (28) to the earth to turn-on the transistors (18), (20). When the switch (8) is shorted, the current is passed to a diode (27) to turn-on a PNP transistor (26) which, in turn, turns-on the transistor (23) and the transistors (18),(20) are turned-on to attenuate the signal similar to FIG. 2. No abnormal switching noise results since almost no DC fluctuation is found at the terminals (30),(31) and the output terminals (10),(12).

Figure 4:
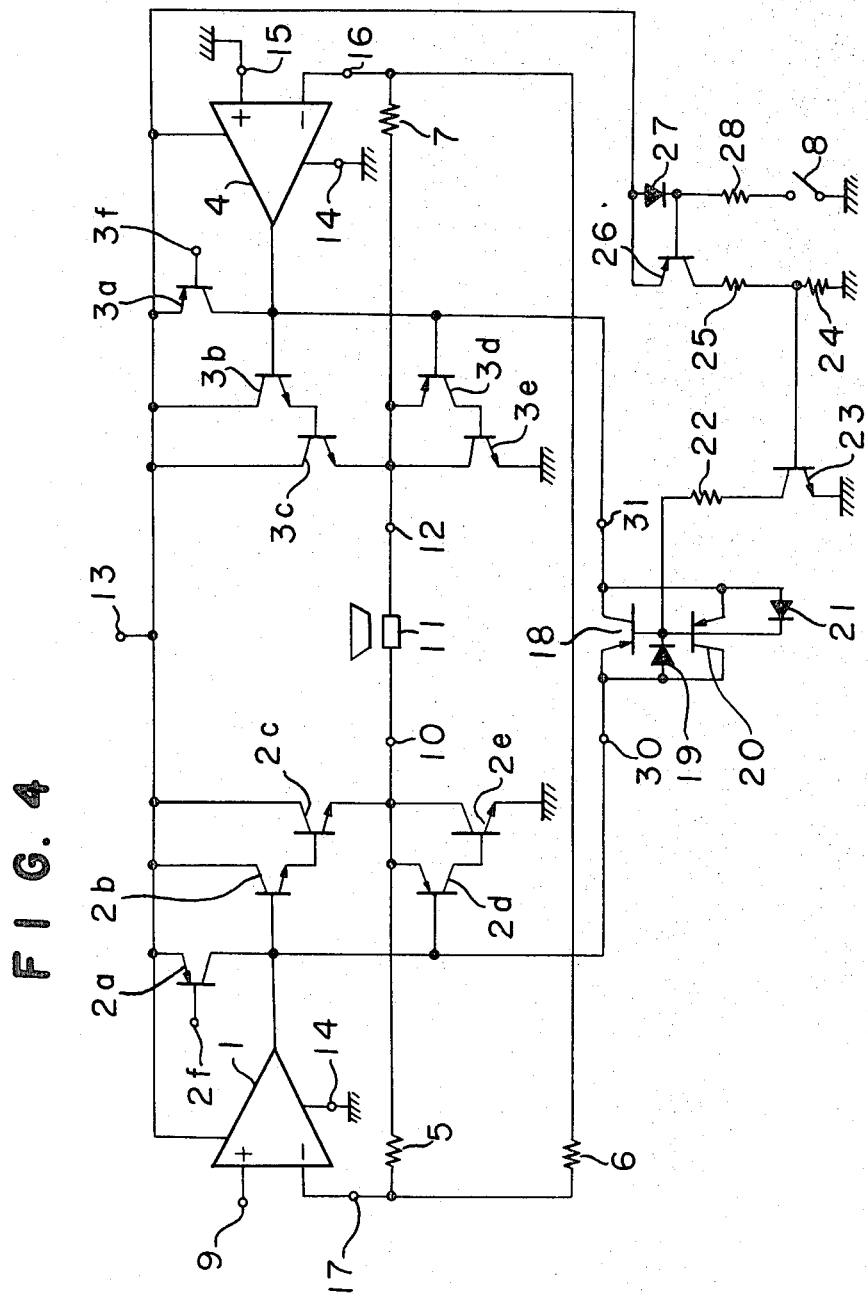

FIG. 4 shows the other embodiment of the invention in which a push-pull amplifier comprising transistors (2a),(2b),(2c),(2d),(2e), and (3a),(3b),(3c),(3d),(3e) is used as the buffer amplifiers (2),(3). It is evident that the positive half wave is amplified by a Darlington transistor comprising the NPN transistors (2b),(2c) and a Darlington transistor comprising the NPN transistors (3b),(3c) and the negative half wave is amplified by a Darlington transistor comprising the PNP transistor (2d), the NPN transistor (2e) and a Darlington transistor comprising the PNP transistor (3d), and NPN transistor (3e). The PNP transistors (2a), (3a) are constant current loads and the base terminals (2f),(3f) of each transistor are suitably biased.

In FIG. 4, the operation-the actuating of the switch (8) to earth the resistor (28)→ the turning-on of the transistor (26)→ the turning-on of the transistor (23)→ the turning-on of the transistors (18),(20)→ attenuation of signal- is similar to that of FIG. 3. Also, almost no DC fluctuation at the output terminals (10),(12) is found.

In the embodiments, PNP transistors are mainly used. However, the same result can be obtained by substituting NPN transistors. for the transistors (18),(20). In this case, it is necessary to substitute a PNP transistor for the transistor (23); to substitute an NPN transistor for the transistor (26); to change the polarities of the diodes (19),(21),(27); to connect the resistor (24) and the emitter of the transistor (23) to the power source terminal; to connect the emitter of the transistor (26) and the cathode of the diode (27) to the earth terminal; and to connect the switch (8) from the power source terminal to the earth terminal (or vice versa).

As described above, the signal-muting circuit of the present invention performs the signal-muting without causing a great fluctuation of DC bias of the amplifier thus preventing the occurrence of the abnormal switching noise and IC can be easily employed in the signal-muting circuit.

I claim:

1. In a signal-muting circuit for a bridge amplifier having a potential source connected to two amplifying means each formed by connecting a non-reversible amplifier and a non-reversible buffer amplifier in series, an improvement characterized in that a switch is connected between the input terminals of the non-reversible buffer amplifiers as the final stage in each of said amplifying means so as to form a short-circuit whereby a signal is muted.

2. A signal-muting circuit according to claim 1 wherein thenon-reversible amplifiers respectively and the non-reversible buffer amplifiers respectively have the same voltage gain.

3. A signal-muting circuit according to claim 2 wherein each of said amplifier means has a feed-back resistor connected between the output terminal and the feed-back input terminal of each said amplifier means and wherein said feed-back resistors of each amplifying means are equal.

4. A signal-muting circuit according to claim 1 wherein the switch is formed by a first transistor whose emitter and collector are connected between the input terminals of the buffer amplifiers; a second transistor whose collector, emitter and base are respectively connected to the emitter, the collector and the base of the first transistor; a third transistor whose collector is connected through a first resistor to the bases of the first and the second transistors, whose emitter is connected to one of a positive and negative terminal of said potential source and whose base is connected through a second resistor to said one terminal of said potential source and a first mechanical switch which is connected through a third resistor between the base of the third transistor and the other of said positive or negative terminal of said potential source.

5. A signal-muting circuit according to claim 4 wherein the first mechanical switch is formed by a fourth transistor whose collector and emitter are connected between the third resistor and the other of the potential sources and a second mechanical switch connected through a fourth resistor between the base of the fourth transistor and one of the potential sources.

6. A signal-muting circuit according to claim 5 wherein a diode connected between the base and the emitter of the fourth transistor.

7. A signal-muting circuit according to any one of claim 4, 5, or 6 wherein the buffer amplifier is a push-pull amplifier.

8. A signal-muting circuit according to claim 4, 5, or 6 wherein a diode is connected between the base and the emitter of the first and second transistors respectively.

9. A signal-muting circuit according to claim 7 wherein a diode is connected between the base and the emitter of the first and the second transistors respectively.

* * * * *